US010211166B2

(12) United States Patent
Matsuo

(10) Patent No.: US 10,211,166 B2
(45) Date of Patent: Feb. 19, 2019

(54) SEMICONDUCTOR DEVICE AND METHOD OF MANUFACTURING THE SAME

(71) Applicant: Toshiba Memory Corporation, Tokyo (JP)

(72) Inventor: Kouji Matsuo, Ama Aichi (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/695,312

(22) Filed: Sep. 5, 2017

(65) Prior Publication Data

US 2018/0277497 A1 Sep. 27, 2018

(30) Foreign Application Priority Data

Mar. 24, 2017 (JP) .................................. 2017-060009

(51) Int. Cl.
| | |
|---|---|
| *H01L 23/58* | (2006.01) |
| *H01L 21/768* | (2006.01) |
| *H01L 25/00* | (2006.01) |
| *H01L 25/18* | (2006.01) |
| *H01L 23/532* | (2006.01) |
| *H01L 27/11582* | (2017.01) |

(52) U.S. Cl.
CPC ...... *H01L 23/585* (2013.01); *H01L 21/76802* (2013.01); *H01L 21/76877* (2013.01); *H01L 23/53295* (2013.01); *H01L 25/18* (2013.01); *H01L 25/50* (2013.01); *H01L 27/11582* (2013.01)

(58) Field of Classification Search
CPC ............ H01L 23/585; H01L 23/53295; H01L 21/76802; H01L 21/76877; H01L 25/18; H01L 25/50; H01L 27/11582
See application file for complete search history.

(56) References Cited

U.S. PATENT DOCUMENTS

| | | | |
|---|---|---|---|
| 6,228,753 B1 | 5/2001 | Lo et al. | |
| 6,472,293 B1 | 10/2002 | Suga | |
| 9,111,591 B2 | 8/2015 | Tanzawa | |
| 2002/0070454 A1* | 6/2002 | Yasukawa | H01L 21/76254 257/760 |
| 2006/0151881 A1 | 7/2006 | Yamada | |
| 2007/0178693 A1* | 8/2007 | Jeng | H01L 27/0688 438/666 |

(Continued)

FOREIGN PATENT DOCUMENTS

| | | |
|---|---|---|
| JP | 3532788 B2 | 5/2004 |
| JP | 2006-196668 | 7/2006 |

*Primary Examiner* — Sitaramarao S Yechuri
(74) *Attorney, Agent, or Firm* — Kim & Stewart LLP

(57) ABSTRACT

According to one embodiment, a semiconductor device includes a first semiconductor circuit layer including a first conductive layer, a second semiconductor circuit layer including a second conductive layer, and a third semiconductor circuit layer between the first semiconductor circuit layer and the second semiconductor circuit layer, the third semiconductor circuit layer including a third conductive layer in contact with the first conductive layer, a fourth conductive layer in contact with the second conductive layer, and a fifth conductive layer in contact with the third conductive layer and electrically connected to the fourth conductive layer. The fifth conductive layer has a width that is narrower than a width of the third conductive layer.

19 Claims, 13 Drawing Sheets

(56) References Cited

U.S. PATENT DOCUMENTS

| | | | |
|---|---|---|---|
| 2011/0095367 A1* | 4/2011 | Su | H01L 23/481 257/355 |
| 2015/0091124 A1* | 4/2015 | Liu | H01L 27/1464 257/459 |

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2017-060009, filed Mar. 24, 2017, the entire contents of which are incorporated herein by reference.

FIELD

An embodiment of the present disclosure relates to a semiconductor device and a method of manufacturing the same.

BACKGROUND

To increase the capacity and to improve the performance of a semiconductor device, there is a technique involving the bonding of a plurality of devices together. The bonded devices maybe of the same or different types of semiconductor circuits. By bonding multiple devices, the storage capacity of the semiconductor device thus formed can be increased, for example. Furthermore wiring delays and resistance losses between different semiconductor circuits can be reduced, and the performance of the semiconductor device can be improved.

When devices are bonded to both the upper surface and the lower surface of another device, it is necessary to form electrodes for electrically connecting the devices on each of the upper surface and the lower surface of the device. It is desirable that the electrode structure of does not prevent the reduction of chip size for the semiconductor device.

DETAILED DESCRIPTION

Figure 1:
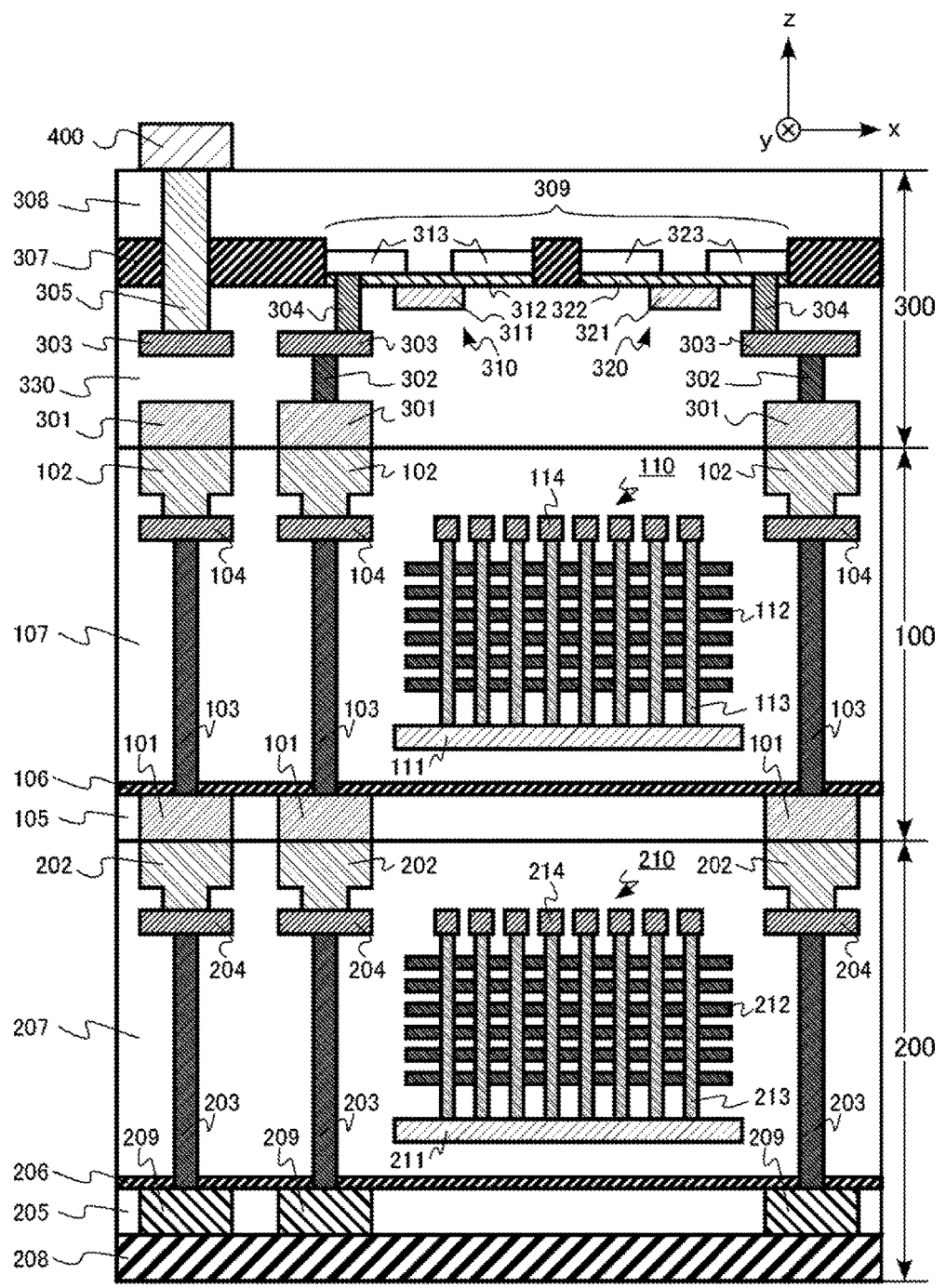
FIG. 1 is a schematic cross-sectional view of a semiconductor device according to an embodiment.

In general, according to one embodiment, a semiconductor device includes a first semiconductor circuit layer including a first conductive layer, a second semiconductor circuit layer including a second conductive layer, and a third semiconductor circuit layer between the first semiconductor circuit layer and the second semiconductor circuit layer, the third semiconductor circuit layer including a third conductive layer in contact with the first conductive layer, a fourth conductive layer in contact with the second conductive layer, and a fifth conductive layer in contact with the third conductive layer and electrically connected to the fourth conductive layer. The fifth conductive layer has a width that is narrower than a width of the third conductive layer.

An example embodiment of the present disclosure will be described below with reference to the accompanying drawings. In the following description, substantially similar components are denoted by the same reference numerals and a detailed description of those components will be omitted.

In the present disclosure, a "semiconductor circuit layer" refers to a layer on at least a part of which a wiring, a transistor, a diode and the like made of a semiconductor material are provided. Further, a "semiconductor circuit substrate" refers to a substrate on at least a part of which a wiring, a transistor, a diode and the like made of a semiconductor material are provided.

Hereinafter, a semiconductor device and a method of manufacturing the semiconductor device according to an embodiment will be described with reference to the drawings.

FIG. 1 is a schematic cross-sectional view of the semiconductor device in the xz plane.

A semiconductor memory of the embodiment includes a first memory layer 100, also referred to as a third semiconductor circuit layer, a second memory layer 200, also referred to as a first semiconductor circuit layer, a peripheral circuit layer 300, referred to as a second semiconductor circuit layer, and an electrode pad 400. The semiconductor device is a semiconductor memory having a stack of the first memory layer 100 and the second memory layer 200 each having a three-dimensional memory cell array, and the peripheral circuit layer 300 including a control circuit for controlling the memory cell arrays. The first memory layer 100, the second memory layer 200, and the peripheral circuit layer 300 are stacked in the z direction in FIG. 1.

The first memory layer 100 includes a first electrode 101, also referred to as a third conductive layer, a second electrode 102, also referred to as a fourth conductive layer, a contact plug 103, also referred to as a fifth conductive layer, a wiring layer 104, an inter-electrode insulating layer 105, a diffusion preventing layer 106, insulating and including nitrogen, an interlayer insulating layer 107 and a memory cell array 110. The memory cell array 110 includes a source line 111, word lines 112, channel layers 113 and bit lines 114.

The second memory layer 200 includes an electrode 202, also referred to as a first conductive layer, a contact plug 203, also referred to as a sixth conductive layer, a wiring layer 204, an inter-electrode insulating layer 205, a diffusion preventing layer 206, an interlayer insulating layer 207, a stopper layer 208, a sacrificial layer 209 made of polycrystalline semiconductor and a memory cell array 210. The memory cell array 210 includes a source line 211, word lines 212, channel layers 213 and bit lines 214.

The peripheral circuit layer 300 includes an electrode 301, also referred to as a second conductive layer, a contact plug 302, a wiring layer 303, a contact plug 304, a Through Silicon Via (TSV) 305, an element isolation area 307, a silicon substrate 308, a peripheral circuit 309 and an interlayer insulating layer 330. The peripheral circuit 309 includes Metal Insulator Semiconductor Field Effect Transistor (MISFET), also referred to as a first transistor 310 and a second transistor 320. The first transistor 310 includes a source/drain region 313, a gate electrode 311 and a gate insulating film 312. The second transistor 320 includes a source/drain region 323, a gate electrode 321 and a gate insulating film 322.

The first memory layer 100 is provided between the second memory layer 200 and the peripheral circuit layer 300. The second memory layer 200 is directly bonded to one surface of the first memory layer 100. The peripheral circuit layer 300 is directly bonded to the other surface of the first memory layer 100.

The first electrode 101 in the first memory layer 100 is in direct contact with the electrode 202 in the second memory layer 200. The first electrode 101 and the electrode 202 are electrically connected to each other. The second electrode 102 in the first memory layer 100 is in direct contact with the electrode 301 in the peripheral circuit layer 300. The second electrode 102 and the electrode 301 are electrically connected to each other.

The first electrode 101 comprises, for example copper (Cu). For example, a barrier metal film is provided in a region in contact with the contact plug 103 in the first electrode 101, a region in contact with a stopper layer 108 in the first electrode 101, and a region in contact with the inter-electrode insulating layer 105 in the first electrode 101. The barrier metal film is, for example, a metal nitride film. The metal nitride film is, for example, tantalum nitride (TaN), titanium nitride (TiN) or niobium nitride (NbN).

The second electrode 102 is made of, for example, metal containing copper (Cu). For example, a barrier metal film is provided in a region in contact with the wiring layer 104 in the second electrode 102 and a region in contact with the inter-electrode insulating layer 107 in the second electrode 102. The barrier metal film is, for example, a metal nitride film. The metal nitride film is made of, for example, tantalum nitride (TaN),titanium nitride (TiN) or niobium nitride (NbN).

The contact plug 103 and the wiring layer 104 are provided between the first electrode 101 and the second electrode 102. The first electrode 101 and the second electrode 102 are electrically connected to each other by the contact plug 103 and the wiring layer 104.

The wiring layer 104 is made of, for example, metal containing tungsten (W).

Figure 2:
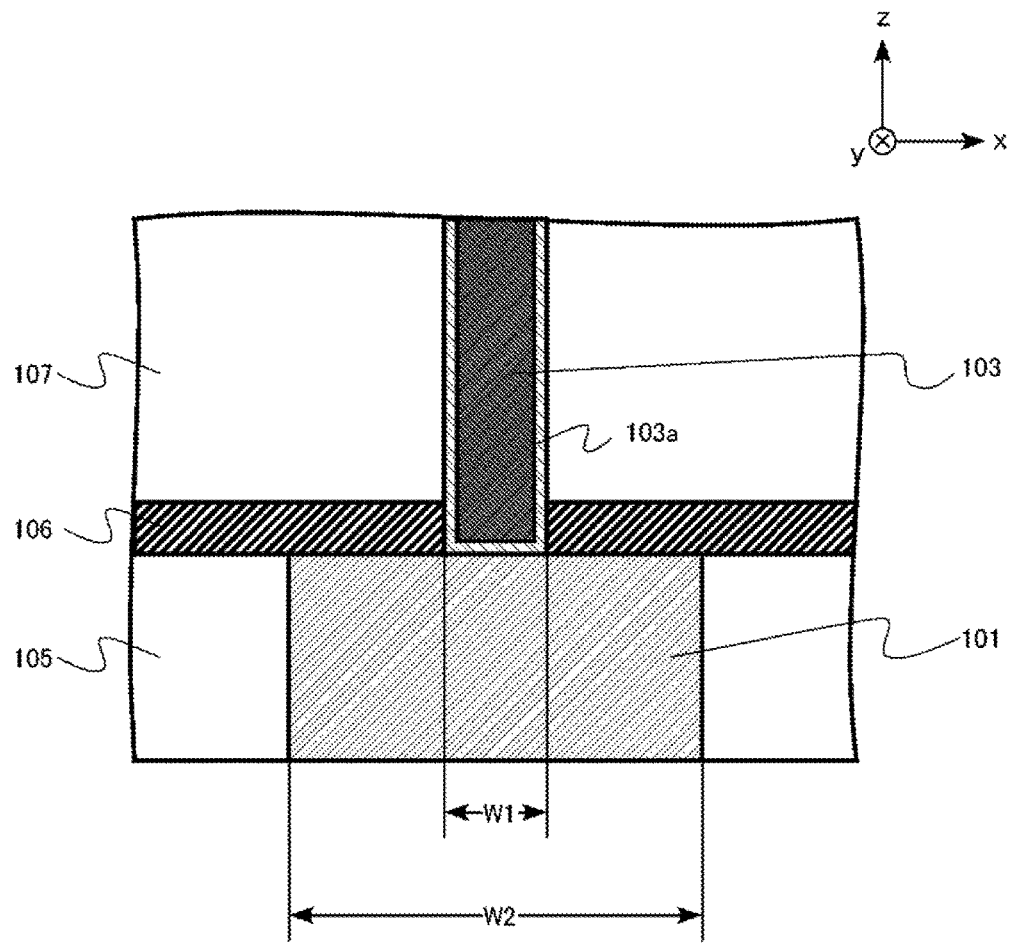
FIG. 2 is an enlarged schematic cross-sectional view of a part of a semiconductor device according to the embodiment.

FIG. 2 is an enlarged schematic cross-sectional view of a part of the semiconductor device where the first electrode 101 and the contact plug 103 are in contact with each other. FIG. 2 shows the xz cross section of the semiconductor device as an example, which is the same as the yz cross section.

The first width W1 in FIG. 2 of the contact plug 103 in the region where the first electrode 101 and the contact plug 103 are in contact with each other is narrower than the second width W2 in FIG. 2 of the first electrode 101 in the region. In other words, the first width W1 of the contact plug 103 in the vicinity of the contact surface between the first electrode 101 and the contact plug 103 is narrower than the second width W2 of the first electrode 101 in the vicinity of the contact surface. Further, in other words, the first width W1 of the contact surface between the first electrode 101 and the contact plug 103 is narrower than the second width W2 of the surface including the contact surface of the first electrode 101. The difference between the second width and the first width is, for example, 0.1 μm or more, preferably, 0.5 μm or more. If the difference is below this range, the contact plug 103 may be unconnected to the first electrode 101 due to misalignment in lithography during manufacturing.

The surface of the first electrode 101 has, for example, a square shape, and the length of one side is, for example, 0.3 μm or more and 5 μm or less. The length of one side is, for example, 1 μm. The side surface of the first electrode 101 may have, for example, a tapered shape or a stepped shape.

The material of the contact plug 103 may be different from the material of the first electrode 101. The contact plug 103 is made of, for example, metal containing tungsten (W).

The contact plug 103 includes a barrier metal film 103a in contact with the first electrode 101. The barrier metal film 103a is, for example, a metal nitride film. The metal nitride film is made of, for example, tantalum nitride (TaN), titanium nitride (TiN) or niobium nitride (NbN). The barrier metal film 103a is also in contact with the inter-electrode insulating layer 105 and the interlayer insulating layer 107.

The inter-electrode insulating layer 105 is made of, for example, silicon oxide, silicon oxynitride, or silicon nitride. From the viewpoint of preventing diffusion of copper from an electrode, that is, from the first electrode 101, it is preferable that the inter-electrode insulating layer 105 contains nitrogen (N) therein.

The diffusion preventing layer 106 is an insulating layer. The diffusion preventing layer 106 has a function of preventing diffusion of copper from an electrode from the first electrode 101 to the interlayer insulating layer 107. The diffusion preventing layer 106 preferably contains nitrogen (N) therein.

The diffusion preventing layer 106 is made of, for example, silicon nitride or nitrogen-doped silicon carbide.

The interlayer insulating layer 107 is made of, for example, silicon oxide.

Referring back to FIG. 1, in the memory cell array 110, for example, nonvolatile memory cells are three-dimensionally arranged. The memory cell array 110 is provided between two contact plugs 103.

The plurality of word lines 112 is stacked in the z direction in the interlayer insulating layer 107. The plurality of word lines 112 extend in the x direction parallel to the upper surface and the lower surface of the first memory layer 100. The number of stacked layers of the word lines 112 is, for example, 20 or more and 100 or less. The word lines 112 are made of, for example, metal.

The plurality of channel layers 113 is provided so as to cross the word lines 112. The channel layers 113 extend in a direction perpendicular to the upper surface and the lower surface of the first memory layer 100. One end of each of the channel layers 113 is electrically connected to the source line 111. The channel layer 113 is made of, for example, polycrystalline silicon. The source line 111 is made of, for example, polycrystalline silicon.

The plurality of bit lines 114 extends in a direction parallel to the upper surface and the lower surface of the first memory layer 100. The other end of each of the channel layers 113 opposite to the source line 111 is electrically connected to each of the bit lines 114.

For example, a charge accumulation layer, which is not specifically depicted, is provided in a region where each of the word lines 112 crosses each of the channel layers 113. A region where each of the word lines 112 crosses each of the channel layers 113 functions as one nonvolatile memory cell.

The second memory layer 200 is different from the first memory layer 100 in that it includes the stopper layer 208 and the sacrificial layer 209. Each of the electrode 202, the contact plug 203, the wiring layer 204, the inter-electrode insulating layer 205, the diffusion preventing layer 206 and the interlayer insulating layer 207 has the same configuration as that of each of the second electrode 102, the contact plug 103, the wiring layer 104, the inter-electrode insulating layer 105, the diffusion preventing layer 106 and the interlayer insulating layer 107. Further, the memory cell array 210 has the same configuration as that of the memory cell array 110. The memory cell array 210 is provided between two contact plugs 203.

The sacrificial layer 209 is sandwiched between portions of the inter-electrode insulating layer 205. The sacrificial layer 209 is, preferably, a material that can be selectively etched with respect to each of the inter-electrode insulating layers 205. In addition, the sacrificial layer 209 is, preferably, a material that can be etched by wet etching. The sacrificial layer 209 may be a polycrystalline semiconductor, for example, polycrystalline silicon or polycrystalline silicon germanium.

The stopper layer 208 is provided on the lower surface of the inter-electrode insulating layer 205. The stopper layer 208 is, for example, silicon oxide.

The width of the contact plug 203 in the region where the contact plug 203 and the sacrificial layer 209 are in contact with each other is narrower than the width of the sacrificial layer 209 in the region. In other words, the width of the contact plug 203 in the vicinity of the contact surface between the contact plug 203 and the sacrificial layer 209 is narrower than the width of the sacrificial layer 209 in the vicinity of the contact surface.

The peripheral circuit layer 300 is provided on the first memory layer 100. The electrode 301 comprises, for example, copper (Cu). For example, a barrier metal film is provided in a region in contact with the contact plug 302 in the electrode 301 and in a region in contact with the interlayer insulating layer 330 in the electrode 301. The barrier metal film is, for example, a metal nitride film. The metal nitride film is, for example, tantalum nitride (TaN), titanium nitride (TiN) or niobium nitride (NbN).

The contact plug 302, the wiring layer 303 and the contact plug 304 comprise, for example, tungsten (W).

The peripheral circuit 309 is, for example, a peripheral circuit of the memory cell array 110 and the memory cell array 210. The peripheral circuit 309 may also be a sense amplifier circuit, a word line driver circuit, a row decoder circuit, a column decoder circuit, a booster circuit or the like.

The element isolation area 307 is provided in the silicon substrate 308. The silicon substrate 308 is single crystal silicon. The element isolation area 307 is, for example, silicon oxide.

The TSV 305 penetrates the silicon substrate 308 and the element isolation area 307, and is in contact with the wiring layer 303. The TSV 305 is, for example, a metal containing copper.

The electrode pad 400 is provided to obtain electrical conduction between the semiconductor memory and the outside. A bonding wire may be connected to the electrode pad 400.

Next, a method of manufacturing the semiconductor device will be described. FIGS. 3 to 15 are schematic cross-sectional views illustrating the semiconductor device in the middle of manufacture in a method of manufacturing the semiconductor device.

The method of manufacturing the semiconductor device of the embodiment includes bonding a first semiconductor circuit substrate having a semiconductor substrate, an insulating layer on the semiconductor substrate, a sacrificial layer on the insulating layer, a first conductive layer provided on a surface opposite to the semiconductor substrate, and a second conductive layer in contact with the sacrificial layer and electrically connected to the first conductive layer, and a second semiconductor circuit substrate having a third conductive layer on the surface so that the first conductive layer is in contact with the third conductive layer, removing the semiconductor substrate and the insulating layer so that the sacrificial layer is exposed, removing the sacrificial layer to form an opening, embedding a fourth conductive layer in the opening, and bonding the first semiconductor circuit substrate and a third semiconductor circuit substrate having a fifth conductive layer on the surface so that the fourth conductive layer is in contact with the fifth conductive layer.

Figure 3:
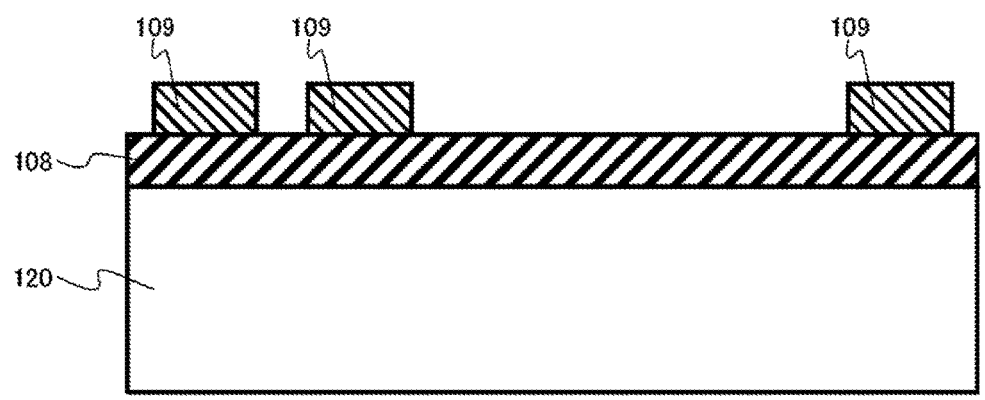
FIGS. 3-15 are schematic cross-sectional views of a method of manufacturing a semiconductor device according to the embodiment.

First, a first semiconductor wafer 150 (first semiconductor circuit substrate) is manufactured. As shown in FIG. 3, the stopper layer 108 is formed on a silicon substrate 120. The stopper layer 108 functions as an etching stopper when the silicon substrate 120 is removed in a later step. The stopper layer 108 is, for example, silicon oxide. A sacrificial layer 109 is formed on the stopper layer 108. The sacrificial layer 109 is, for example, polycrystalline silicon.

Figure 4:
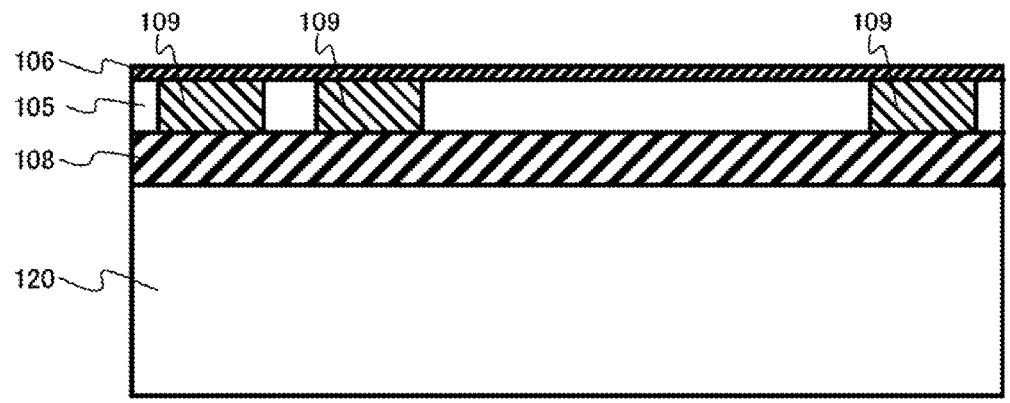

Next, as shown in FIG. 4, the inter-electrode insulating layer 105 is formed between portions of the sacrificial layer 109. The inter-electrode insulating layer 105 is, for example, silicon oxide. The diffusion preventing layer 106 is formed on the inter-electrode insulating layer 105. The diffusion preventing layer 106 is, for example, silicon nitride.

Figure 5:
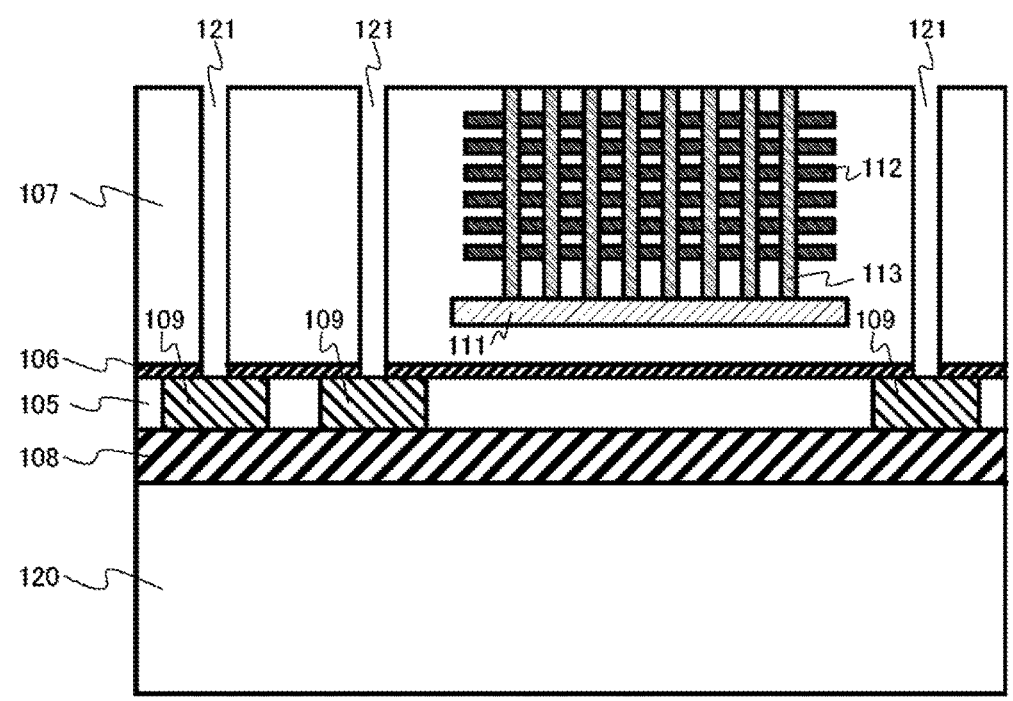

Next, as shown in FIG. 5, the interlayer insulating layer 107 is formed on the diffusion preventing layer 106. The interlayer insulating layer 107 is, for example, silicon oxide. In the interlayer insulating layer 107, the source line 111, the word lines 112, and the channel layers 113 are formed. A contact hole 121 reaching the sacrificial layer 109 is formed from the upper surface of the interlayer insulating layer 107.

Figure 6:
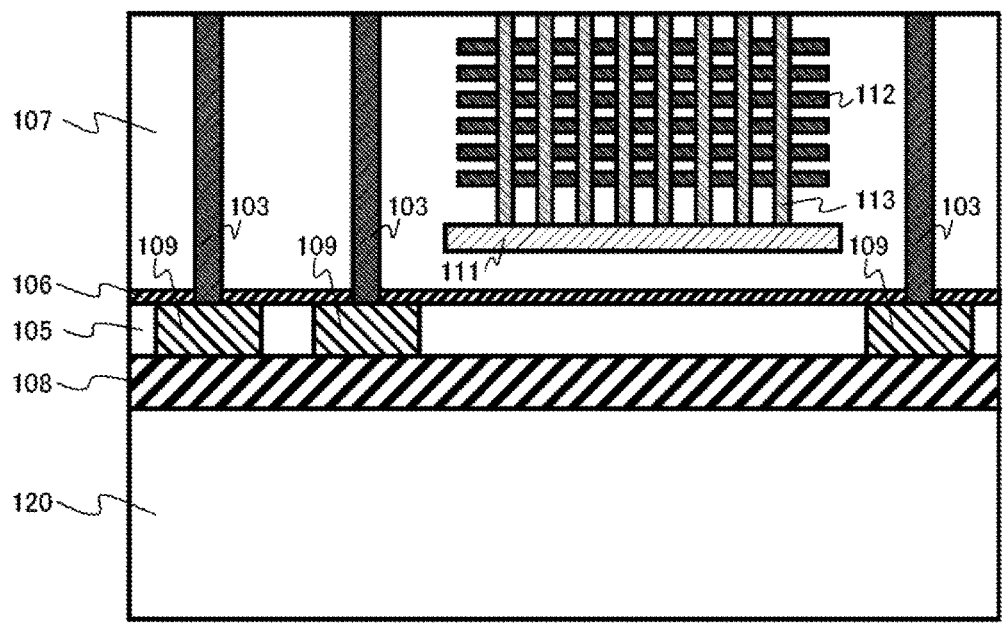

Next, as shown in FIG. 6, the contact plug 103 (second conductive layer) is formed in the contact hole 121. The contact plug 103 is, for example, tungsten or a metal containing tungsten.

Figure 7:
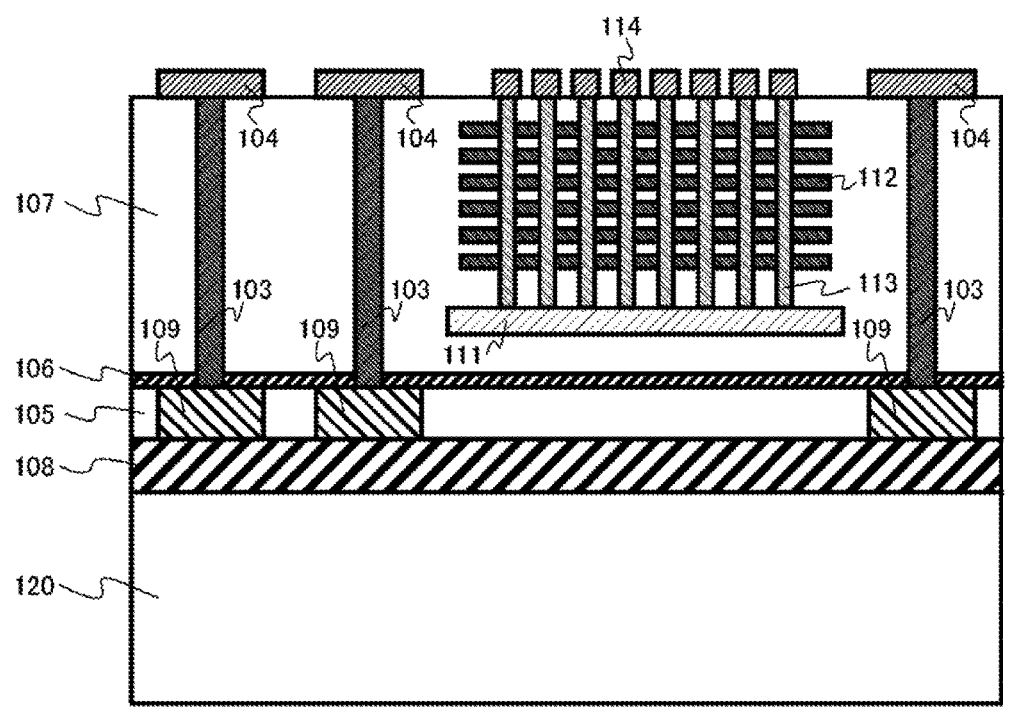

Next, as shown in FIG. 7, the wiring layer 104 in contact with the contact plug 103 and the bit lines 114 in contact with the channel layers 113 are formed on the upper surface of the interlayer insulating layer 107. The wiring layer 104 and the bit lines 114 are, for example, a metal including tungsten.

Figure 8:
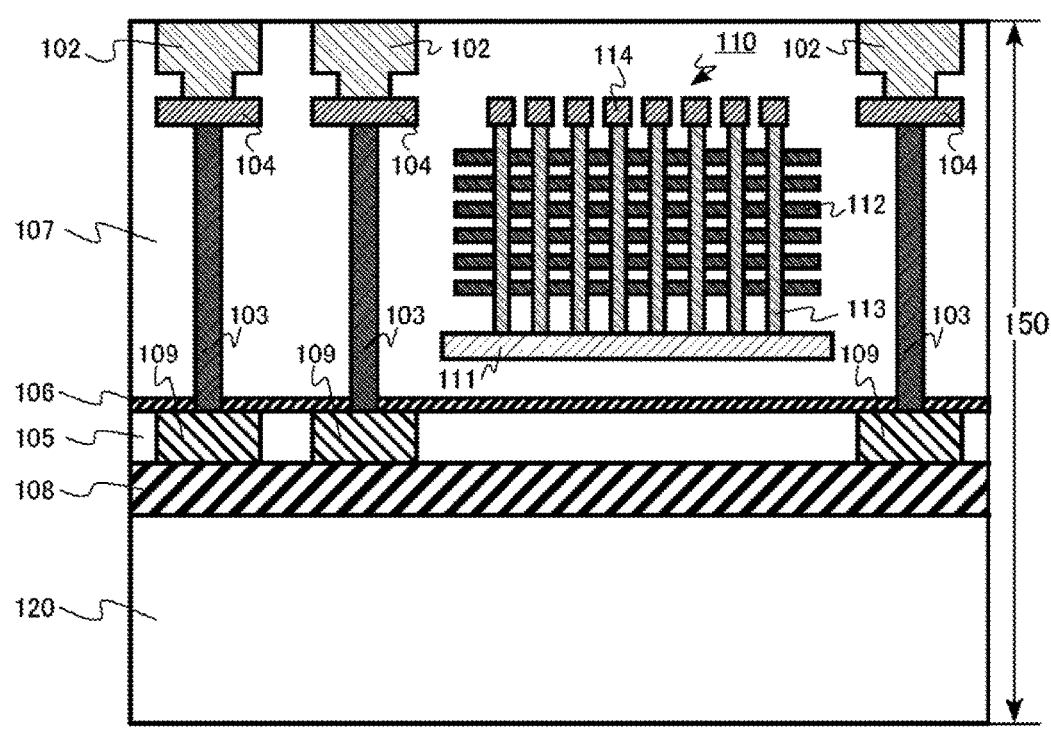

Next, as shown in FIG. 8, an insulating layer integrated with the interlayer insulating layer 107, to be apart thereof is formed. Next, the second electrode 102 (first conductive layer) in contact with the wiring layer 104 is formed. The second electrode 102 is electrically connected to the contact plug 103. The second electrode 102 is, for example, a metal containing copper.

Through the above steps, the first semiconductor wafer 150 is manufactured.

Figure 9:
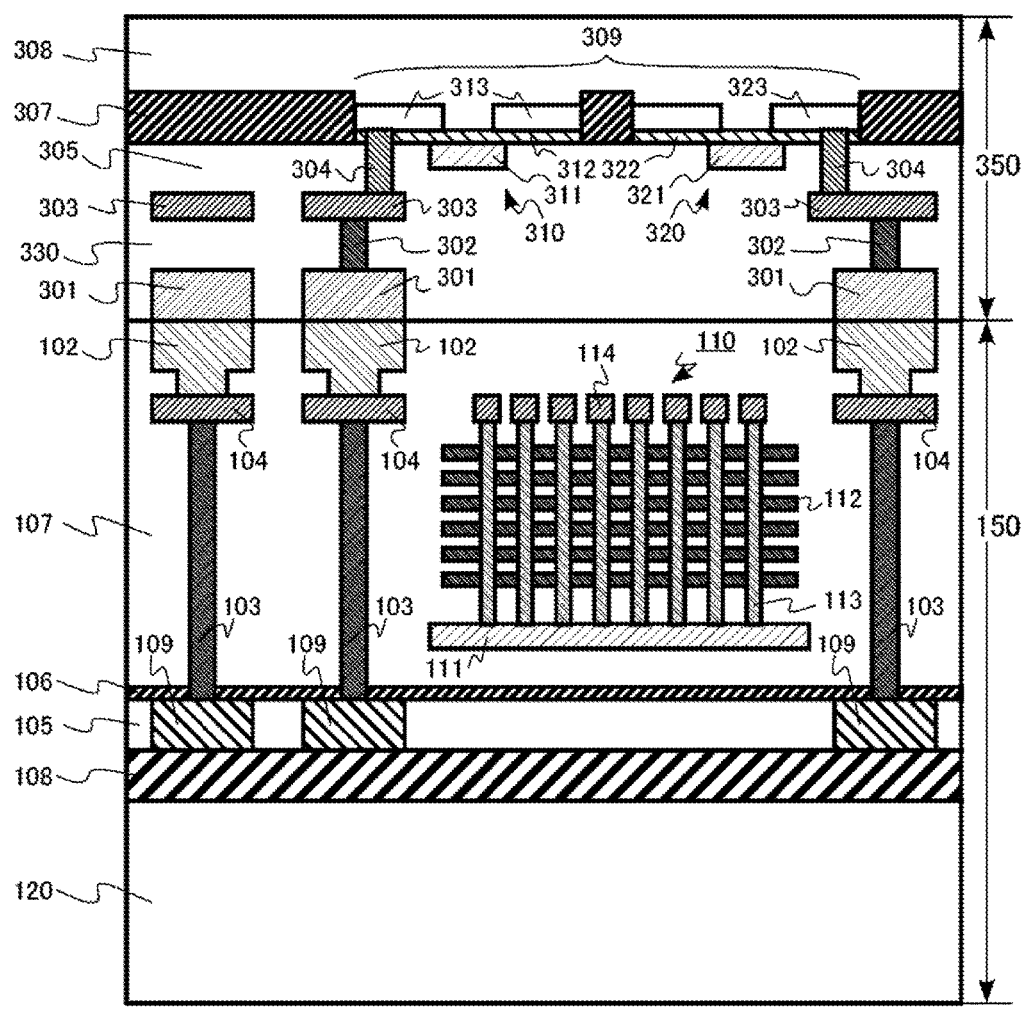

Next, as shown in FIG. 9, a second semiconductor wafer 350, also referred to as a second semiconductor circuit substrate, which has been manufactured in advance, is bonded to the first semiconductor wafer 150. The electrode 301, can also be referred to as a third conductive layer in this context, the contact plug 302, the wiring layer 303, the contact plug 304, the element isolation area 307, the silicon substrate 308, the peripheral circuit 309 and the interlayer insulating layer 330 are formed on the second semiconductor wafer 350. The peripheral circuit 309 includes the first transistor 310 and the second transistor 320. The first transistor 310 includes the source/drain region 311, the gate electrode 312 and the gate insulating film 313. The second transistor 320 includes the source/drain region 321, the gate electrode 322 and the gate insulating film 323.

The first semiconductor wafer 150 and the second semiconductor wafer 350 are bonded so that the second electrode 102 in the first semiconductor wafer 150 and the electrode 301 in the second semiconductor wafer 350 are in direct contact with each other.

At the time of bonding the first semiconductor wafer 150 and the second semiconductor wafer 350, for example, at least one of the surface of the first semiconductor wafer 150 and the surface of the second semiconductor wafer 350 is subjected to plasma treatment.

Figure 10:
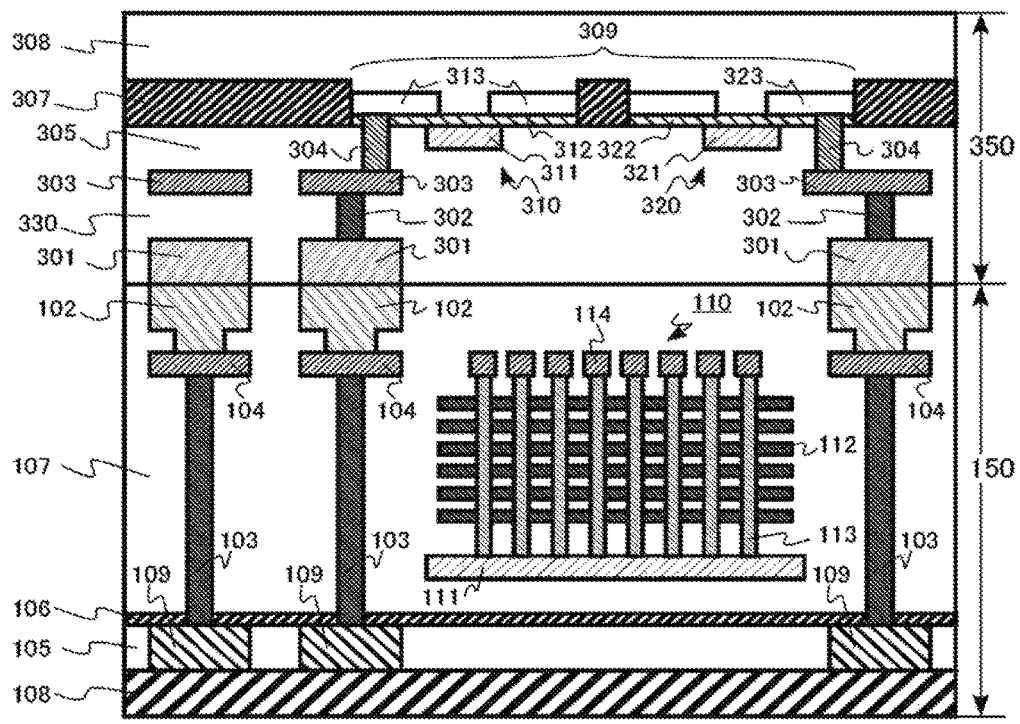

Next, as shown in FIG. 10, the silicon substrate 120 is removed. The silicon substrate 120 is thinned by, for example, rear surface grinding, and then completely removed using alkali-based wet etching.

Figure 11:
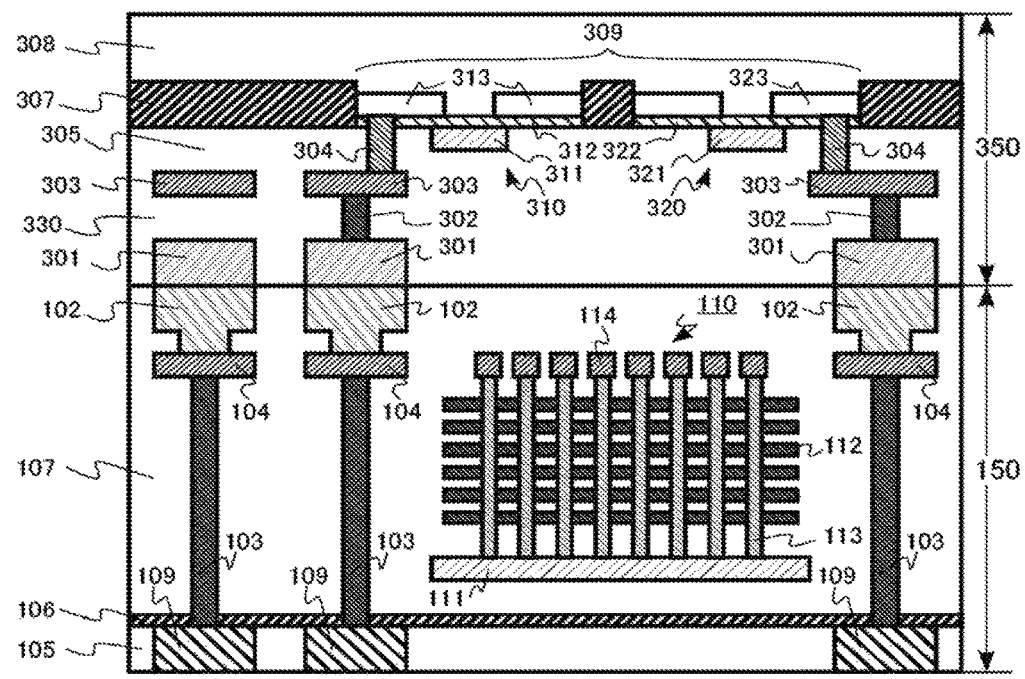

Next, as shown in FIG. 11, the stopper layer 108 is removed so that the sacrificial layer 109 is exposed. The silicon oxide stopper layer 108 is removed by, for example, hydrofluoric acid-based wet etching.

Figure 12:
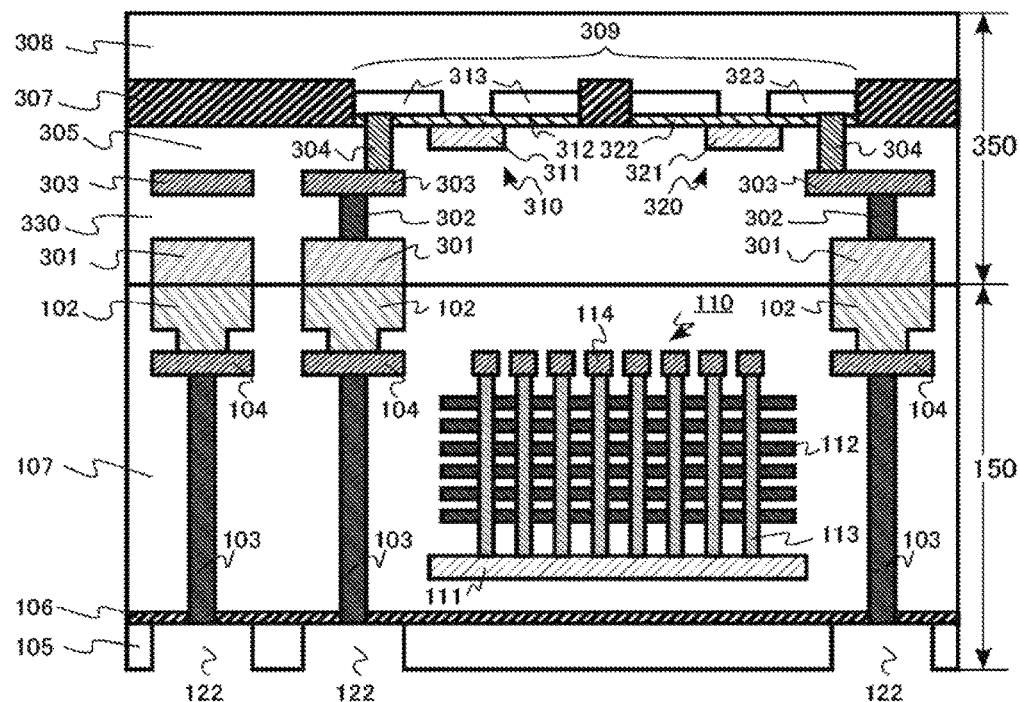

Next, as shown in FIG. 12, the sacrificial layer 109 is selectively removed to form an opening 122. The sacrificial layer 109 of polycrystalline silicon can be selectively removed using alkali-based wet etching.

Figure 13:
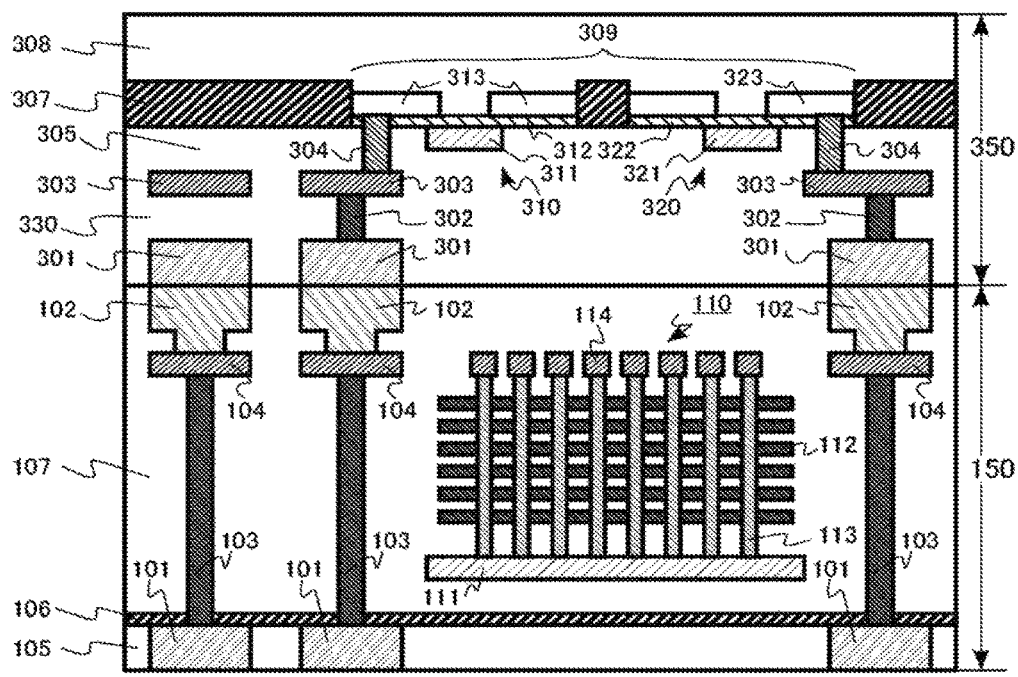

Next, as shown in FIG. 13, the first electrode 101 (fourth conductive layer) is embedded in the opening 122. The first electrode 101 is formed, for example, by depositing copper by an electroless plating method.

Figure 14:
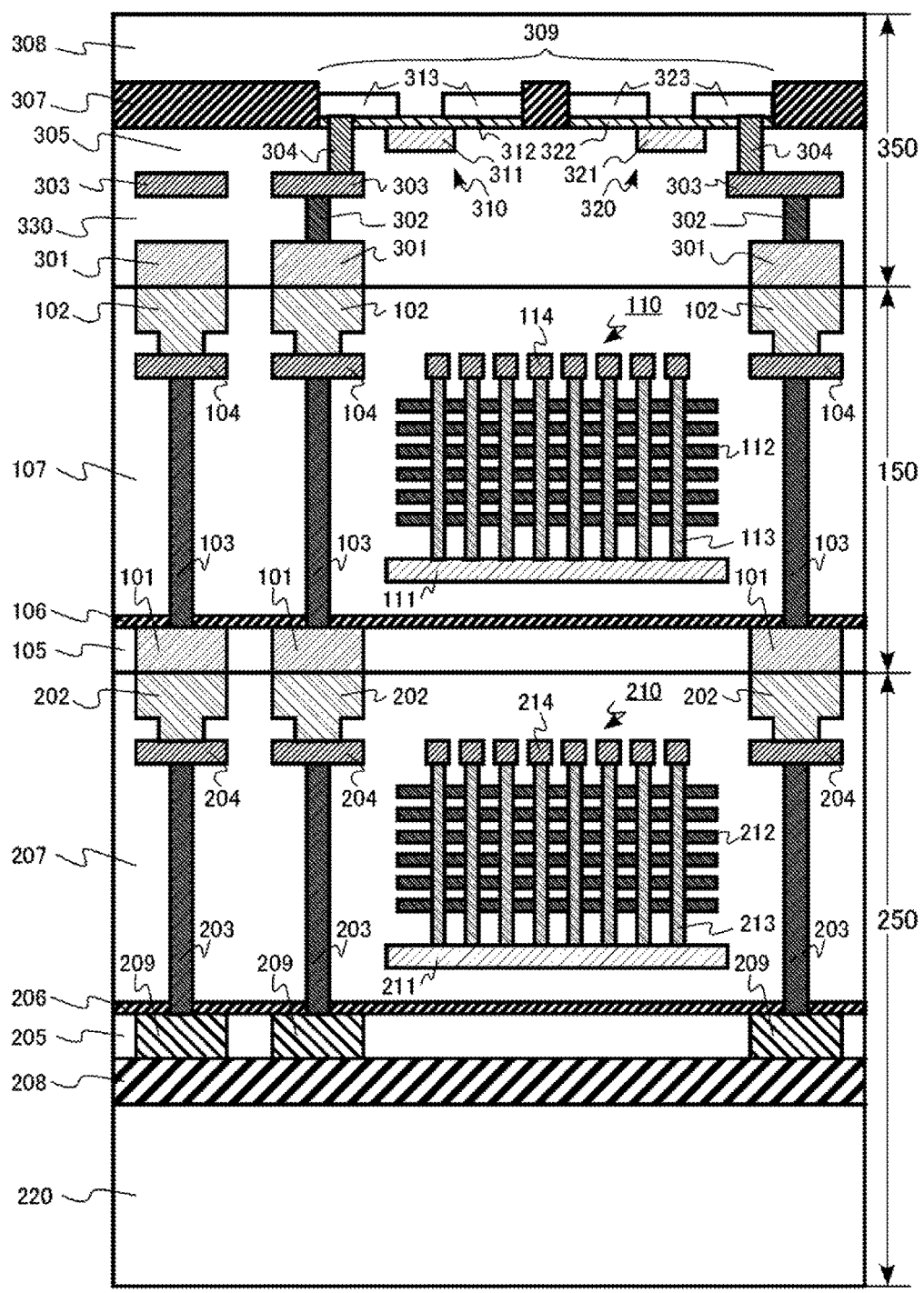

Next, as shown in FIG. 14, a third semiconductor wafer 250, also referred to here as a third semiconductor circuit substrate, which has been manufactured in advance, is bonded to the first semiconductor wafer 150. In the third semiconductor wafer 250, the electrode 202, the contact plug 203, the wiring layer 204, the inter-electrode insulating layer 205, the diffusion preventing layer 206, the interlayer insulating layer 207, the stopper layer 208, the sacrificial layer 209 and the memory cell array 210 are formed on a silicon substrate 220. The memory cell array 210 includes the source line 211, the word lines 212, the channel layers 213 and the bit lines 214. The third semiconductor wafer 250 has substantially the same structure as that of the first semiconductor wafer shown in FIG. 8.

The first semiconductor wafer 150 and the third semiconductor wafer 250 are bonded so that the first electrode 101 in the first semiconductor wafer 150 and the electrode 202 in the third semiconductor wafer 250 are indirect contact with each other.

When bonding the first semiconductor wafer 150 and the third semiconductor wafer 250, at least one of the surface of the first semiconductor wafer 150 and the surface of the third semiconductor wafer 250 maybe subjected to plasma treatment, for example.

Figure 15:
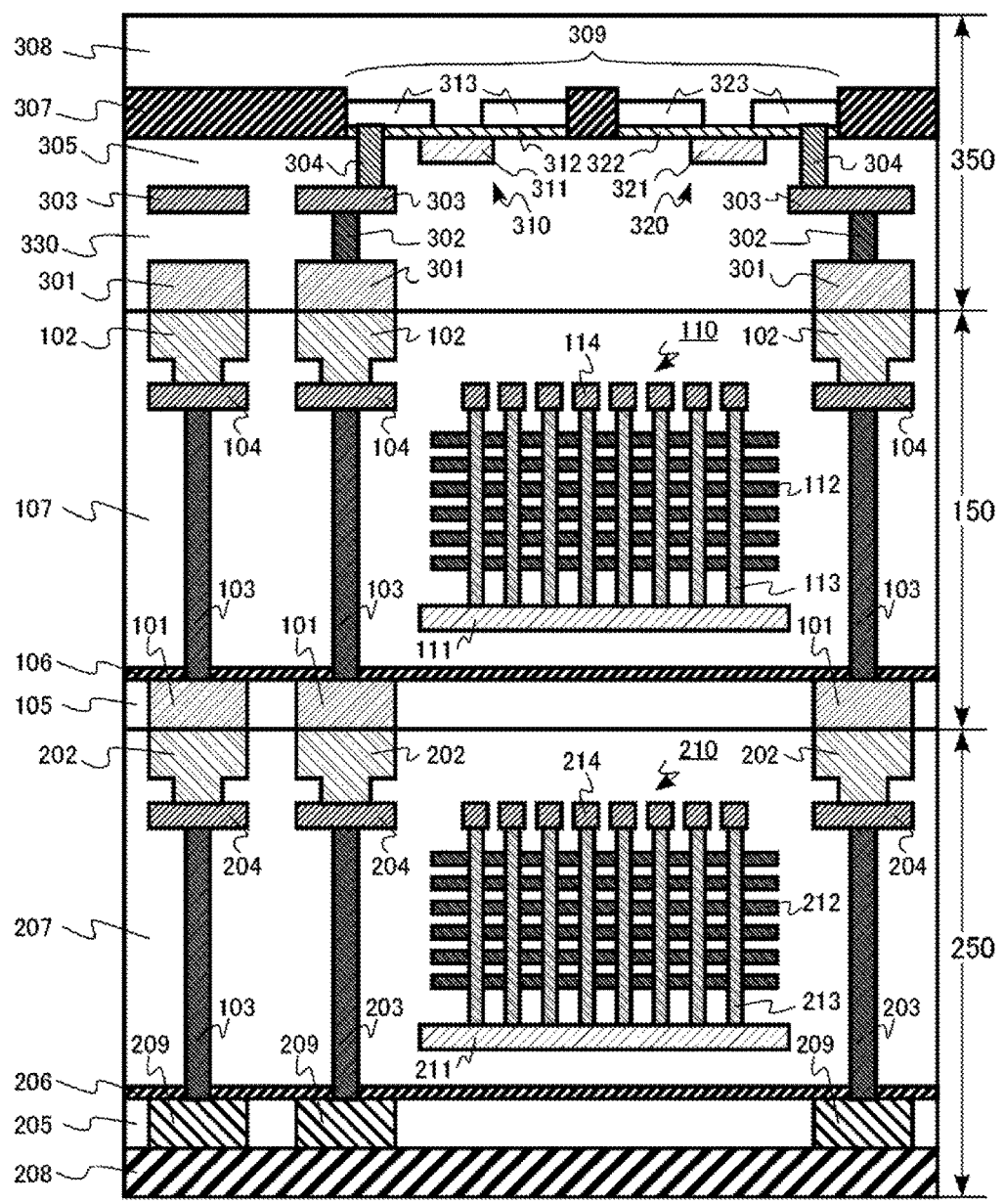

Next, as shown in FIG. 15, the silicon substrate 220 is removed. The silicon substrate 220 is thinned by, for example, rear surface grinding, and then the remainder is completely removed using alkali-based wet etching.

Next, the TSV 305 and the electrode pad 400 are formed.

Next, a plurality of semiconductor memories formed on the stacked wafer obtained by bonding the first semiconductor wafer 150, the second semiconductor wafer 350 and the third semiconductor wafer 250 are fragmented, for example, using a dicing device. By the manufacturing method described above, the semiconductor memory shown in FIG. 1 is formed.

Next, the operation and the effects of the semiconductor device of the embodiment will be described.

According to the example embodiment described herein, a semiconductor memory having a large storage capacity is realized by stacking the first memory layer 100 and the second memory layer 200. Further, by directly bonding the first memory layer 100 and the second memory layer 200, and the first memory layer 100 and the peripheral circuit layer 300, for example, the chip size of the semiconductor memory is reduced. Further, for example, wiring delay and resistance loss between semiconductor circuits are reduced, and the performance of the semiconductor memory is improved.

When a different device is bonded to each of the upper surface and the lower surface of another device, it is necessary to form an electrode for electrically connecting these devices on the upper surface and the lower surface of the device. There is a demand to provide a large number of electrodes on the device for such things as transmission of input/output signals, for transmission of control signals, and for power supply. However, as the arrangement pitch (e.g., center-to-center spacing distance) between the electrodes to be formed on a device increases, a reduction in the chip size of the semiconductor device may be hindered. In particular, it is difficult to reduce the pitch of the electrodes on the rear surface side of the device formed at the final stage of manufacturing the device as compared with the pitch of the electrodes on the front surface side. This is because, for example, when lithography is performed on the rear surface side, it is still necessary to align the pattern formed on the rear surface with the front surface components, and such alignment accuracy is generally poor. Furthermore, flatness of the underlying layer will typically be poor as compared with the front surface side. Therefore, patterning with high accuracy on the rear surface is difficult as a result.

Figure 16:
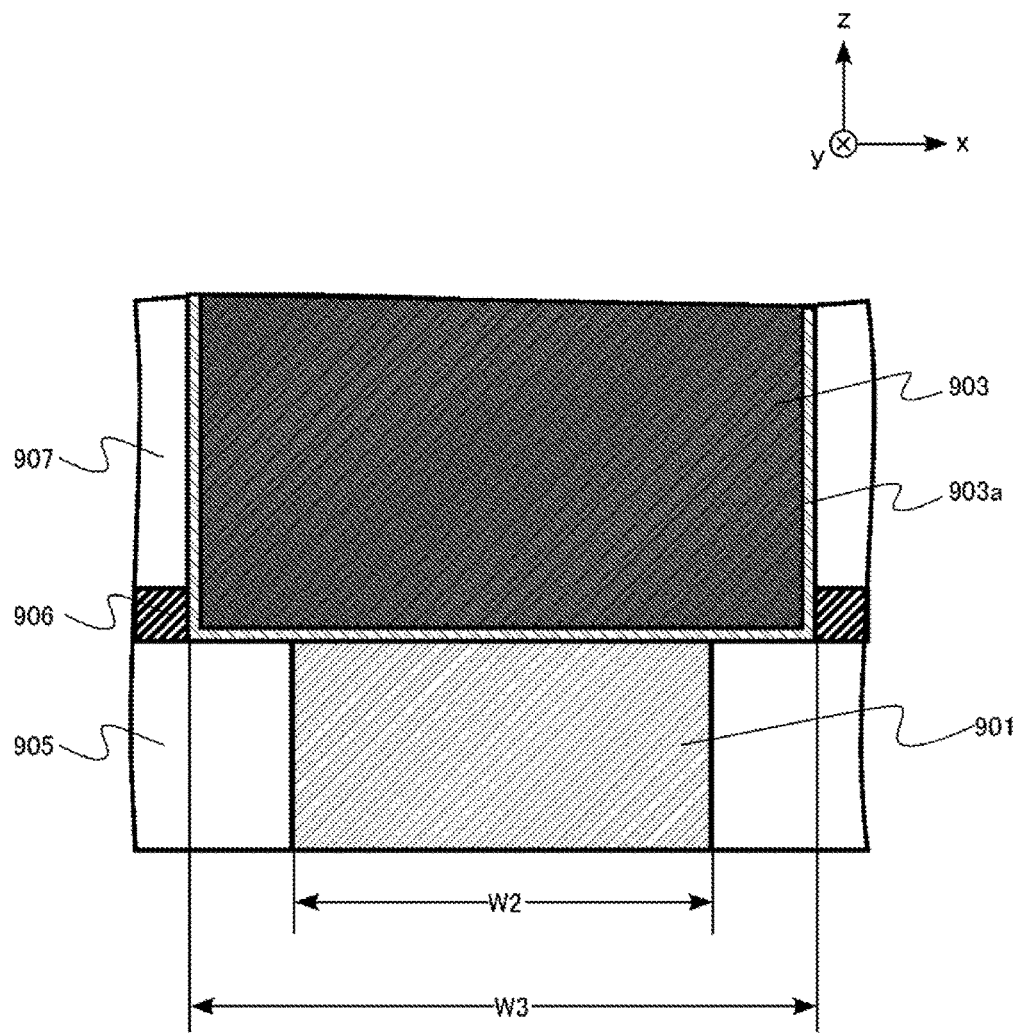
FIG. 16 is a diagram of a semiconductor device according to the embodiment.

FIG. 16 is an enlarged schematic cross-sectional view of a part of a semiconductor device of a first comparative example. FIG. 16 is a schematic cross-sectional view of a portion of the semiconductor device of the first comparative example otherwise corresponding to the semiconductor device depicted in FIG. 2.

The semiconductor device of the first comparative example shown in FIG. 16 includes an electrode 901, a contact plug 903, an inter-electrode insulating layer 905, a diffusion preventing layer 906 and an interlayer insulating layer 907, corresponding to the first electrode 101, the contact plug 103, the inter-electrode insulating layer 105, the diffusion preventing layer 106, and the interlayer insulating layer 107 of the embodiment, respectively.

The electrode 901 is made of, for example, metal containing copper (Cu).

The material of the contact plug 903 is, for example, different from the material of the electrode 901. The contact plug 103 is made of, for example, metal containing tungsten (W).

The contact plug 903 includes a barrier metal film 903a in contact with the electrode 901. The barrier metal film 903a is, for example, a metal nitride film. The metal nitride film is made of, for example, tantalum nitride (TaN), titanium nitride (TiN) or niobium nitride (NbN). The barrier metal film 903a is also in contact with the interlayer insulating layer 907 and the diffusion preventing layer 906.

The width W3 in FIG. 16 of the contact plug 903 in the region where the contact plug 903 and the electrode 901 are in contact with each other is wider than the width W2 in FIG. 16 of the electrode 901 in this region.

The electrode 901 may have a restriction to have a predetermined width W2 due to processing or due to electrical characteristics. In the first comparative example, the width W3 in FIG. 16 of the contact plug 903 is wider than the predetermined width W2. It is necessary to increase the distance between two adjacent electrodes 901 as compared with the semiconductor device according to the embodiment described herein, because the contact plug 903 is wider. Therefore, a pitch between two adjacent electrodes 901 increases, which hinders the reduction of the chip size.

In the semiconductor device according to the embodiment described herein, as shown in FIG. 2, the first width W1 of the contact plug 103 is narrower than the second width W2 of the first electrode 101. Therefore, the arrangement pitch between two adjacent first electrodes 101 can be reduced to, for example, the limit of lithography, which does not hinder the reduction of the chip size of the semiconductor device. In other words, the electrode structure of the semiconductor device according to the embodiment described herein is suitable for the reduction of the chip size of the semiconductor device.

Figure 17:
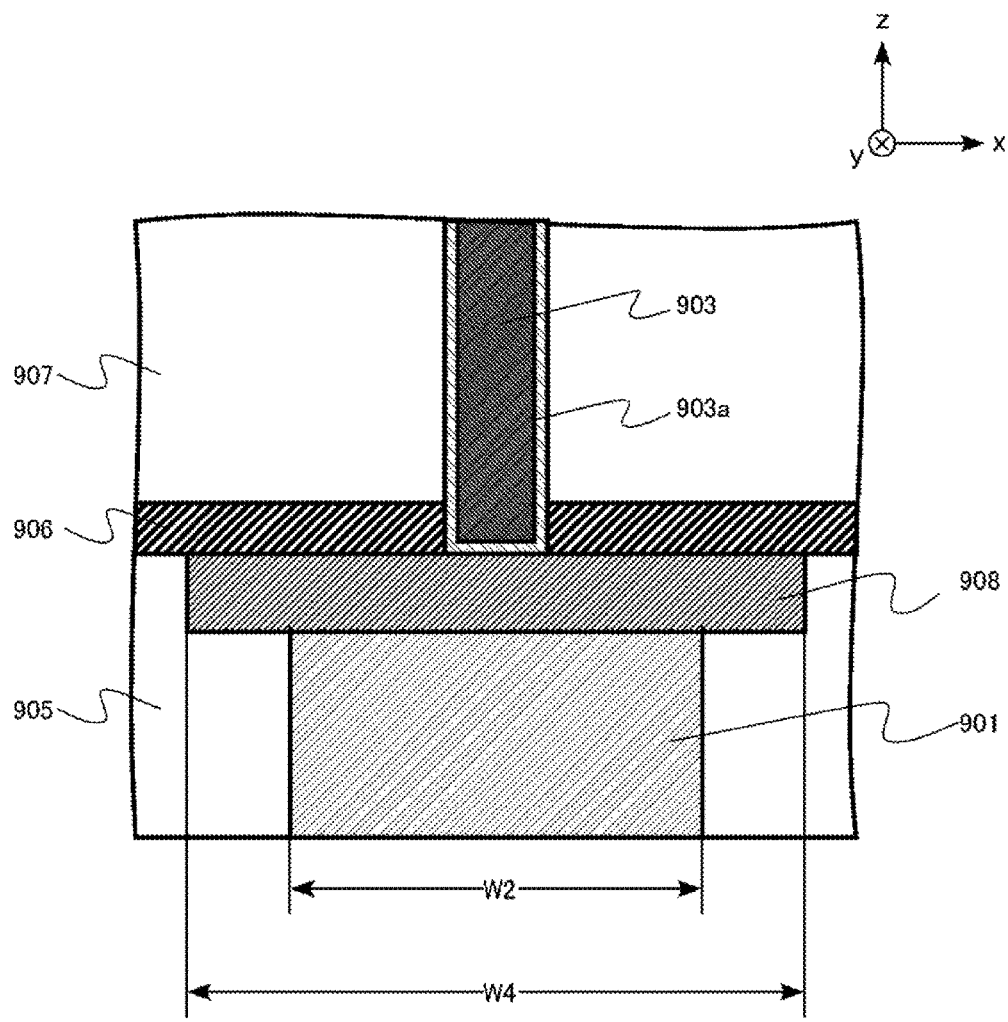
FIG. 17 is a diagram of a semiconductor device according to the embodiment.

FIG. 17 is an enlarged schematic cross-sectional view of a part of a semiconductor device of the second comparative example. FIG. 17 is a schematic cross-sectional view of the portion corresponding to FIG. 2 of the semiconductor device of the second comparative example.

Similar to FIG. 16, in the semiconductor device of the second comparative example shown in FIG. 17, the electrode 901, the contact plug 903, the inter-electrode insulating layer 905, the diffusion preventing layer 906 and the interlayer insulating layer 907 correspond to the first electrode 101, the contact plug 103, the inter-electrode insulating layer 105, the diffusion preventing layer 106 and the interlayer insulating layer 107 in the semiconductor device according to the embodiment described herein, respectively.

Furthermore, the semiconductor device of the second comparative example includes an intermediate layer 908. The intermediate layer 908 is a conductive layer. The intermediate layer 908 is made of, for example, metal containing tungsten (W). The electrode 901 and the contact plug 903 are electrically connected to each other via the intermediate layer 908.

The width W4 in FIG. 17 of the intermediate layer 908 is wider than the width W2 in FIG. 17 of the electrode 901.

The electrode 901 may have a restriction to have a predetermined width W2 due to processing or due to electrical characteristics. In the second comparative example, the width W4 in FIG. 17 of the intermediate layer 908 is wider than the predetermined width W2. It is necessary to increase the distance between two adjacent electrodes 901 as compared with the semiconductor device according to embodiment described herein, because the intermediate layer 908 is wider. Therefore, the arrangement pitch between two adjacent electrodes 901 increases, which hinders the reduction of the chip size of the semiconductor device.

In the semiconductor device according to the embodiment described herein, as shown in FIG. 2, the first width W1 of the contact plug 103 is narrower than the second width W2 of the first electrode 101. Therefore, the arrangement pitch of first electrodes 101 can be reduced to, for example, the limit of lithography, which does not hinder the reduction of the chip size of the semiconductor device. In other words, the electrode structure of the semiconductor device according to the embodiment described herein is suitable for the reduction of the chip size of the semiconductor device.

By using the method of manufacturing the semiconductor device according to the embodiment described herein, the semiconductor device can be manufactured at lower cost.

Next, the operation and effects of the manufacturing method according to the embodiment described herein will be described.

When a device is bonded to each of the upper surface and the lower surface of another device, it is necessary to form an electrode for electrically connecting devices on each of the front surface and the rear surface of the device. In the case of forming an electrode on the rear surface side of the device, when lithography or dry etching with high process cost is used, the manufacturing cost of a semiconductor device by bonding the devices increases. Also, in general, due to the influence of the flatness of the underlying layer or the like, processing accuracy of lithography on the rear surface side is lower than that of the lithography on the front surface side, and thus, the manufacturable pitch of the electrodes may be larger. For this reason, it may be difficult to reduce the chip size of the semiconductor device.

In the first semiconductor wafer 150, the sacrificial layer 109 shown in FIG. 8 is formed in a region which is to be the first electrode 101 on the rear surface side later. Then, prior to bonding the first semiconductor wafer 150 and the third semiconductor wafer 250, the sacrificial layer 109 is removed as shown in FIG. 12. The sacrificial layer 109 is a material that can be selectively removed by wet etching. This makes it possible to form the first electrode 101 on the rear surface side of the first semiconductor wafer 150 without using any additional lithography and dry etching steps, which generally incur high processing costs. Therefore, the manufacturing cost of the semiconductor device can be reduced.

Furthermore, since the first electrode 101 on the rear surface side can be processed without using lithography and dry etching, it is unnecessary to provide intermediate layer 908 as shown in FIG. 17 as a stopper for etching, for example. Therefore, the arrangement pitch of the electrodes can be reduced, and the first electrode 101 on the rear surface side does not hinder the reduction of the chip size of the semiconductor device.

Further, the arrangement pitch of first electrodes 101 on the rear surface side is the arrangement pitch of sacrificial layers 109. Since sacrificial layers 109 are formed by lithography on the front surface side with high processing accuracy, it is possible to reduce the arrangement pitch of the sacrificial layer 109. Therefore, the arrangement pitch of first electrodes 101 on the rear surface side can be reduced, and the chip size of the semiconductor device can be reduced.

Figure 18:
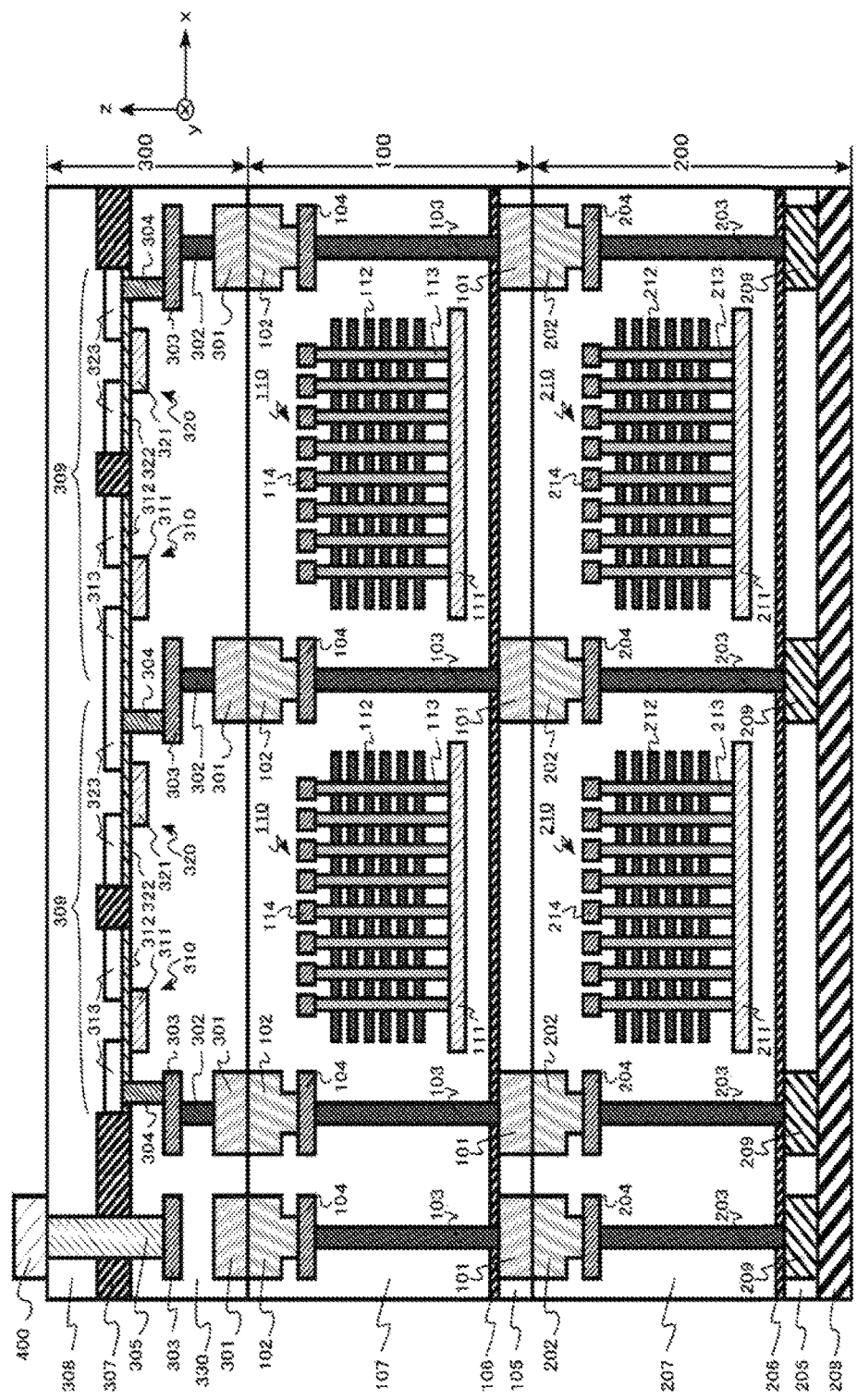
FIG. 18 is a schematic cross-sectional view of a semiconductor device according a modification.

FIG. 18 is a schematic cross-sectional view of a semiconductor device of a modification. The modification is different from the embodiment described herein in that the contact plug 103 is provided between two memory cells 110, and the contact plug 203 is provided between two memory cells 210.

In the embodiment described herein, two memory layers each having a memory cell array are stacked. However, it is also possible to further increase the storage capacity of the semiconductor memory by stacking three or more memory layers.

In the embodiment described herein, the semiconductor device is a semiconductor memory. However, a semiconductor device may be a device other than a semiconductor memory, for example, a logic device, a CMOS sensor and the like.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. For example, a component of one embodiment may be replaced or changed with a component of another embodiment. The accompanying claims and their equivalents are intended to cover such forms or modifications as would fall within the scope and spirit of the inventions.

What is claimed is:

1. A semiconductor device, comprising:
   a first semiconductor circuit layer including a first conductive layer;

a second semiconductor circuit layer including a second conductive layer;

a third semiconductor circuit layer between the first semiconductor circuit layer and the second semiconductor circuit layer, the third semiconductor circuit layer including a third conductive layer in contact with the first conductive layer, a fourth conductive layer in contact with the second conductive layer, and a fifth conductive layer in contact with the third conductive layer and electrically connected to the fourth conductive layer; and a memory cell array in the third semiconductor circuit layer, the memory cell array including a plurality of memory cells that is three-dimensionally arranged and being electrically connectable to another memory cell array in the first semiconductor circuit layer, wherein the fifth conductive layer has a width that is narrower than a width of the third conductive layer.

2. The semiconductor device according to claim 1, wherein the third conductive layer comprises a first material, the fifth conductive layer comprises a second material, and the first material and the second material are different from each other.

3. The semiconductor device according to claim 1, wherein the first conductive layer, the second conductive layer, the third conductive layer, and the fourth conductive layer each comprises copper, and the fifth conductive layer comprises tungsten.

4. The semiconductor device according to claim 1, wherein the fifth conductive layer comprises a metal nitride film in contact with the third conductive layer.

5. The semiconductor device according to claim 1, further comprising:

a peripheral circuit for controlling the memory cell array in the second semiconductor circuit layer.

6. The semiconductor device according to claim 1, further comprising:

an insulating layer between the third conductive layer and the memory cell array and including nitrogen.

7. The semiconductor device according to claim 1, further comprising:

a metal-insulator-semiconductor field effect transistor (MISFET) in the second semiconductor circuit layer.

8. The semiconductor device according to claim 1, further comprising:

a polycrystalline semiconductor layer in the first semiconductor circuit layer and including silicon; and a sixth conductive layer between the first conductive layer and the polycrystalline semiconductor layer, the six conductive layer in contact with the polycrystalline semiconductor layer and electrically connected to the first conductive layer, wherein a width of the sixth conductive layer is narrower than a width of the polycrystalline semiconductor layer.

9. The semiconductor device according to claim 1, further comprising:

a plurality of memory cell arrays in the third semiconductor circuit layer, each memory cell array comprising a plurality of memory cells three-dimensionally arranged; and a plurality of fifth conductive layers, each fifth conductive layer being between two adjacent memory cell arrays in the plurality of memory cell arrays.

10. A method of manufacturing a semiconductor device, comprising:

bonding a first semiconductor circuit substrate to a second semiconductor circuit substrate, wherein the first semiconductor circuit substrate includes a semiconductor substrate, an insulating layer on the semiconductor substrate, a sacrificial layer on the insulating layer, a first conductive layer on a first surface of the first semiconductor circuit substrate opposite the semiconductor substrate, and a second conductive layer contacting the sacrificial layer and electrically connected to the first conductive layer, the second semiconductor circuit substrate includes a third conductive layer on a second surface thereof, and the first semiconductor circuit substrate is bonded to the second semiconductor circuit substrate such that the first conductive layer is in contact with the third conductive layer;

removing the semiconductor substrate and the insulating layer so as to expose the sacrificial layer;

removing the sacrificial layer so as to form an opening exposing the first conductive layer;

forming a fourth conductive layer in the opening; and bonding the first semiconductor circuit substrate to a third semiconductor circuit substrate, wherein the third semiconductor circuit substrate includes a fifth conductive layer on a third surface thereof, and the third semiconductor circuit substrate is bonded to the first semiconductor circuit substrate such that the fourth conductive layer is in contact with the fifth conductive layer.

11. The method of manufacturing the semiconductor device according to claim 10, wherein the sacrificial layer is a polycrystalline semiconductor including silicon.

12. The method of manufacturing the semiconductor device according to claim 10, wherein the first conductive layer, the third conductive layer, the fourth conductive layer and the fifth conductive layer each comprises copper.

13. The method of manufacturing the semiconductor device according to claim 10, wherein the bonding of the second semiconductor circuit substrate to the first semiconductor circuit substrate includes a plasma treatment of at least one of the first surface and the second surface, and the bonding of the first semiconductor circuit substrate to the third semiconductor circuit substrate includes a plasma treatment of at least one of the first surface and the third surface.

14. The method of manufacturing the semiconductor device according to claim 10, wherein the sacrificial layer is removed by wet etching.

15. The method of manufacturing the semiconductor device according to claim 10, wherein the fourth conductive layer is formed by a plating method.

16. The method of manufacturing the semiconductor device according to claim 10, wherein the second conductive layer comprises tungsten.

17. The method of manufacturing the semiconductor device according to claim 10, wherein the first semiconductor circuit substrate includes a three-dimensional memory cell array in which a plurality of memory cells is three-dimensionally arranged.

18. The method of manufacturing the semiconductor device according to claim 17, wherein the second semiconductor circuit substrate includes a peripheral circuit of the three-dimensional memory cell array.

19. The method of manufacturing the semiconductor device according to claim 10, wherein the second semiconductor circuit substrate includes a metal-insulator-semiconductor field effect transistor (MISFET).

\* \* \* \* \*